United States Patent
Hathaway et al.

(10) Patent No.: US 10,128,592 B1
(45) Date of Patent: Nov. 13, 2018

(54) INTEGRATED CIRCUIT INTERFACE AND METHOD OF MAKING THE SAME

(71) Applicants: Aaron Ashley Hathaway, Hanover, MD (US); Robert Miller, Hanover, MD (US); Erica Anne Sanker, Baltimore, MD (US)

(72) Inventors: Aaron Ashley Hathaway, Hanover, MD (US); Robert Miller, Hanover, MD (US); Erica Anne Sanker, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/593,689

(22) Filed: May 12, 2017

(51) Int. Cl.
| | |
|---|---|
| *H05K 1/03* | (2006.01) |
| *H01R 12/70* | (2011.01) |
| *H05K 7/10* | (2006.01) |
| *H05K 1/14* | (2006.01) |
| *H05K 1/11* | (2006.01) |
| *H05K 1/09* | (2006.01) |

(52) U.S. Cl.
CPC ..... *H01R 12/7076* (2013.01); *H01R 12/7047* (2013.01); *H05K 1/09* (2013.01); *H05K 1/111* (2013.01); *H05K 1/115* (2013.01); *H05K 1/144* (2013.01); *H05K 7/10* (2013.01)

(58) Field of Classification Search
CPC ............ H01R 12/7076; H01R 12/7047; H05K 1/111; H05K 1/115; H05K 7/10
USPC ....... 174/255, 250, 251, 256–258, 260, 261; 361/679.01, 679.02, 729, 735, 736, 748
See application file for complete search history.

(56) References Cited

U.S. PATENT DOCUMENTS

| | | | |
|---|---|---|---|
| 4,551,746 A | 11/1985 | Gilbert et al. | |
| 6,057,600 A | 5/2000 | Kitazawa et al. | |
| 6,278,616 B1 * | 8/2001 | Gelsomini | G11C 5/04 257/686 |
| 2009/0179318 A1 * | 7/2009 | Chen | H01L 25/105 257/686 |
| 2009/0283872 A1 * | 11/2009 | Lin | H01L 21/76898 257/621 |

FOREIGN PATENT DOCUMENTS

WO     2000/19532 A1     4/2000

OTHER PUBLICATIONS

International Search Report dated Aug. 17, 2018 for related PCT/US2018/031141.

* cited by examiner

*Primary Examiner* — Tremesha S Willis
(74) *Attorney, Agent, or Firm* — Tarolli, Sundheim, Covell & Tummino LLP

(57) ABSTRACT

One example includes a device that is comprised of a plurality of printed circuit boards, a plurality of vias, and a plurality of castellations. The plurality of printed circuit boards are laminated together, at least some of the plurality of printed circuit boards including a dielectric panel and a plurality of conductor pads. The plurality of vias, through the plurality of conductor pads, include a conductive material to respectively electrically couple the plurality of conductor pads with each other. The plurality of castellations, on at least one side of the plurality of printed circuit boards, to electrically couple each of a plurality of contact pins of an integrated circuit socket with respective contact pads of the plurality of conductor pads.

20 Claims, 13 Drawing Sheets

INTEGRATED CIRCUIT INTERFACE AND METHOD OF MAKING THE SAME

GOVERNMENT INTEREST

The invention was made under U.S. Contract Number 30078128. Therefore, the U.S. Government has rights to the invention as specified in that contract.

TECHNICAL FIELD

The disclosure relates generally to integrated circuits, and more particularly to an integrated circuit interface and method of making the same.

BACKGROUND

Modern integrated circuits have become extremely complicated, some including more than a billion transistors. Although automated design and testing methodology has been implemented for such integrated circuits, physical placement of a newly formulated integrated circuit onto a printed circuit board for testing is still used for further testing. Such placement allows for detection of design and/or manufacturing errors that are not possible with some of the automated design and testing methodology. Thereafter, the errors allow for redesign and retesting of the integrated circuit. Such retesting results in the newly formulated integrated circuit being further tested with it being again physically placed into the printed circuit board.

SUMMARY

In one example, a device is comprised of a plurality of printed circuit boards, a plurality of vias, and a plurality of castellations. The plurality of printed circuit boards are laminated together, at least some of the plurality of printed circuit boards including a dielectric panel and a plurality of conductor pads. The plurality of vias, through the plurality of conductor pads, include a conductive material to respectively electrically couple the plurality of conductor pads with each other. The plurality of castellations, on at least one side of the plurality of printed circuit boards, to electrically couple each of a plurality of contact pins of an integrated circuit socket with respective contact pads of the plurality of conductor pads.

In another example, a method is provided. The method comprises laminating together a plurality of printed circuit boards, at least some of the plurality of printed circuit boards including a dielectric panel and a plurality of conductor pads. The method further comprises forming a plurality of vias through the plurality of conductor pads. The method further comprises disposing a conductive material in the plurality of vias to electrically couple the plurality of conductor pads with each other. The method further comprises forming a plurality of castellations, on at least one side of the plurality of printed circuit boards, to electrically couple each of a plurality of contact pins of an integrated circuit socket with respective contact pads of the plurality of conductor pads.

In yet another example, a device is comprised of a first plurality of printed circuit boards, a second plurality of printed circuit boards, a plurality of vias, a plurality of castellations, and a plurality of wire traces. The first plurality of printed circuit boards are laminated together, each printed circuit board of the first plurality of printed circuit boards including a dielectric panel and a plurality of conductor pads. The second plurality of printed circuit boards, lacking the plurality of conductor pads included with the first plurality of printed circuit boards, are laminated together and to the first plurality of printed circuit boards. The plurality of vias, through the plurality of conductor pads, include a conductive material to respectively electrically couple the plurality of conductor pads with each other. The plurality of castellations, on at least one side of the plurality of printed circuit boards, electrically couple each of a plurality of contact pins of an integrated circuit socket with respective contact pads of the plurality of conductor pads. The plurality of wire traces, on a topmost printed circuit board, electrically couple the plurality of conductor pads to a plurality of conductor bumps disposed on a topmost printed circuit board, the plurality of conductor bumps electrically coupling an integrated circuit to the plurality of wire traces.

DETAILED DESCRIPTION

To facilitate integrated circuit testing, a device (e.g., a testing interface) is utilized between a printed circuit board that the integrated circuit would normally be inserted into and the integrated circuit under test. An example of such a device is comprised of a plurality of printed circuit boards, a plurality of vias, and a plurality of castellations. The plurality of printed circuit boards are laminated together, at least some of the plurality of printed circuit boards including a dielectric panel and a plurality of conductor pads. The plurality of vias, through the plurality of conductor pads, include a conductive material to respectively electrically couple the plurality of conductor pads with each other. The plurality of castellations, on at least one side of the plurality of printed circuit boards, to electrically couple each of a plurality of contact pins of an integrated circuit socket with respective contact pads of the plurality of conductor pads.

Such a testing interface allows for formation of an interface between the integrated circuit socket and the integrated circuit at a great cost savings compared with similar devices utilizing conductive inks that are screen printed on ceramic insulating layers. A testing interface based on ceramic insulating layers also has a long lead time for manufacture and requires a sizeable investment in tooling, deficiencies that are overcome by the printed circuit board based example device disclosed.

Figure 1A:
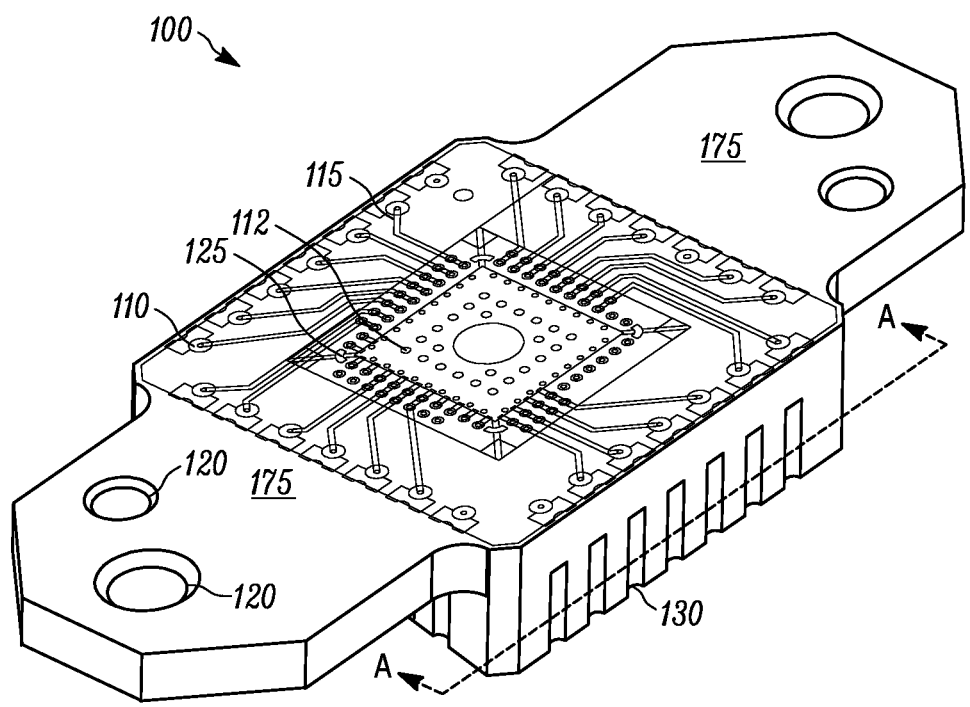
FIGS. 1A-1F illustrate various views of an example testing interface.
Figure 1B:
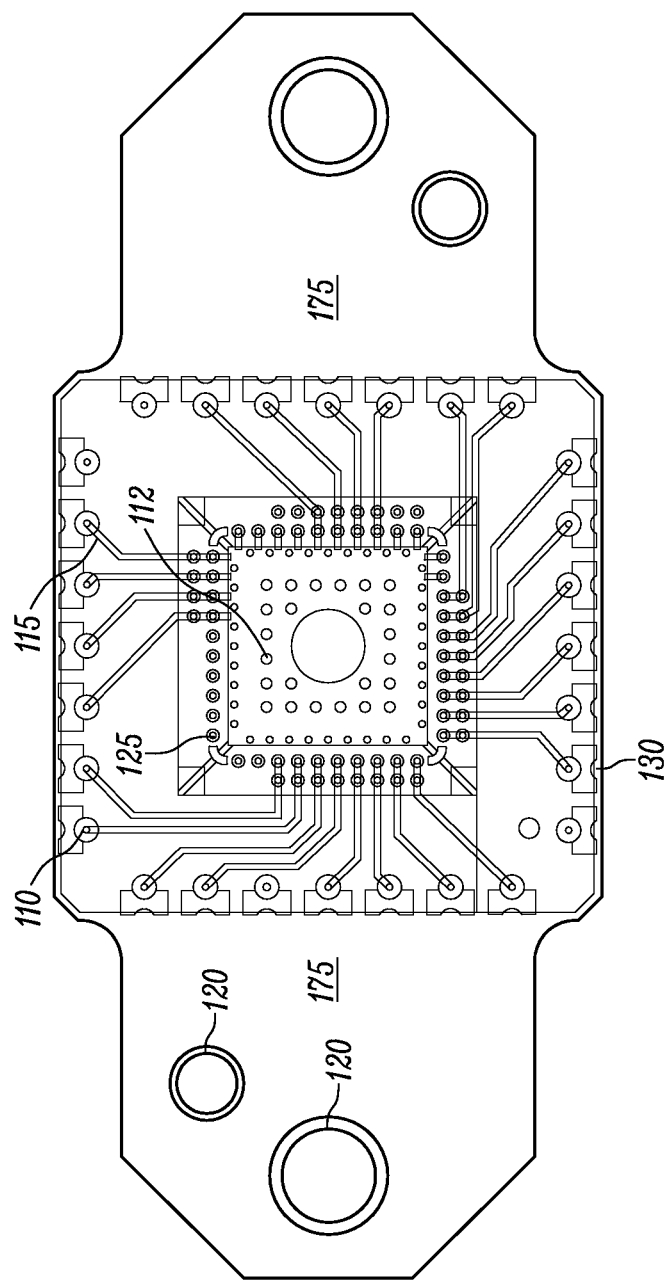
Figure 1C:
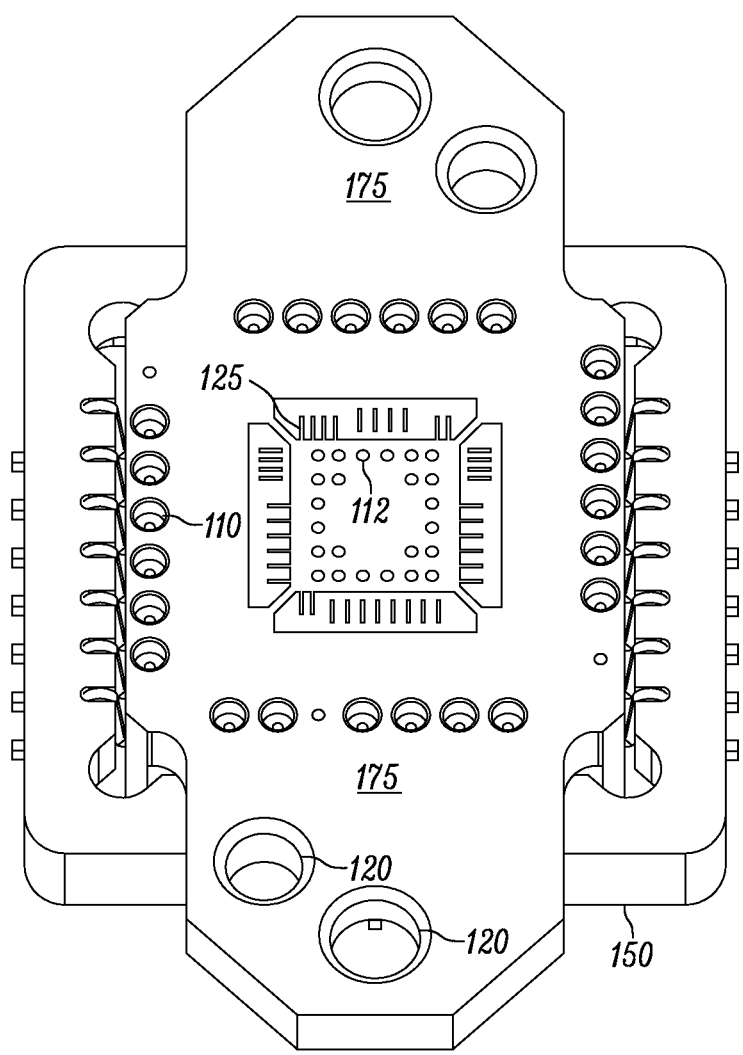
Figure 1D:
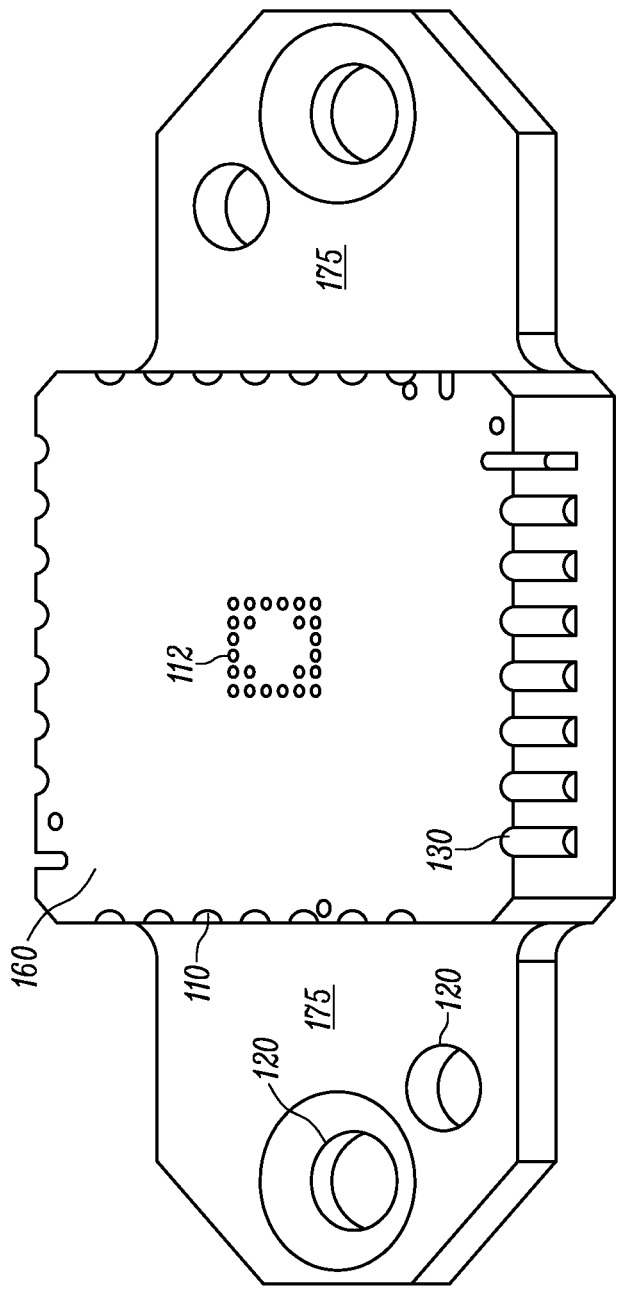
Figure 1E:
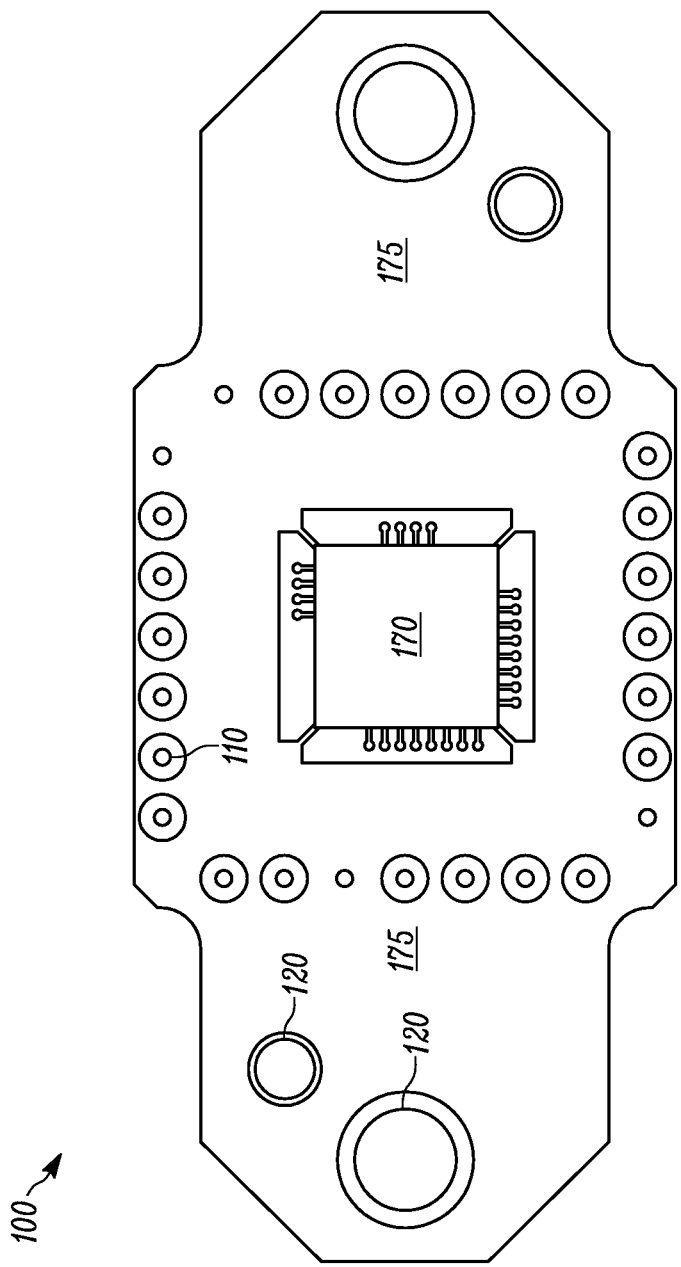
Figure 1F:
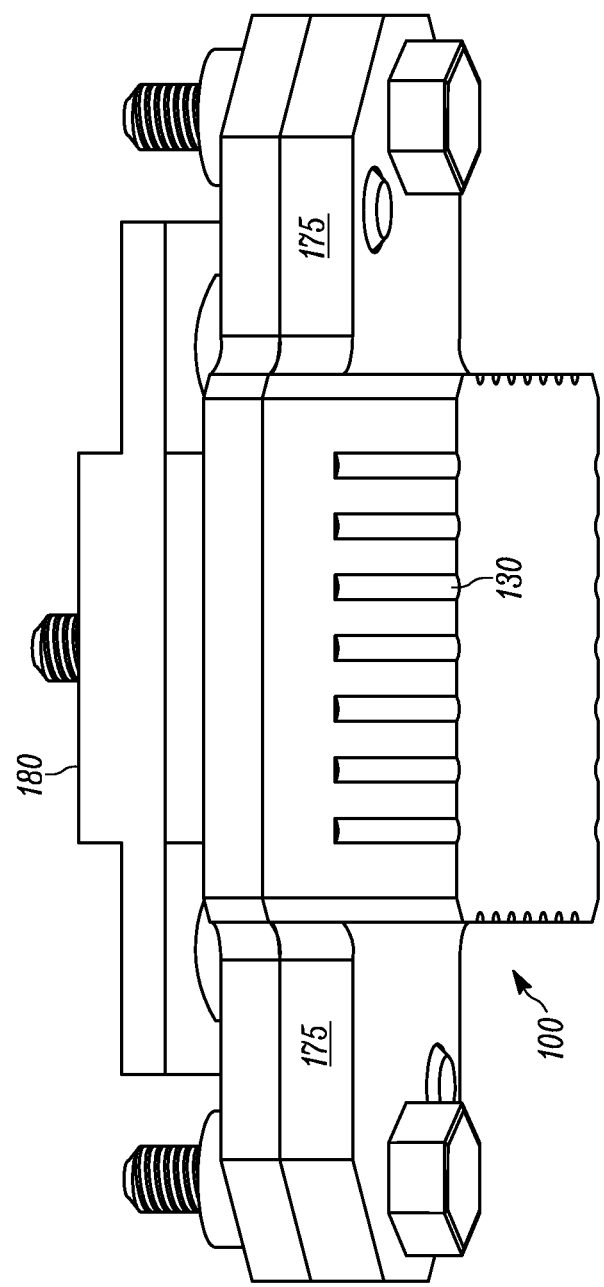

To assist in visual understanding of an example testing interface 100, FIGS. 1A-1F illustrate various views of the example testing interface 100. FIG. 1A illustrates an isometric view of the testing interface 100. FIG. 1B illustrates a top view of the testing interface 100. FIG. 1C illustrates another isometric view of the testing interface 100 mounted in an integrated circuit socket 150. FIG. 1D illustrates an isometric view of the testing interface 100 showing its bottom surface. FIG. 1E illustrates a top view of the testing interface 100 with an integrated circuit 170 disposed thereon. FIG. 1F illustrates a side view of the testing interface 100 with a mounting bracket 180 mounted thereon.

Figure 2:
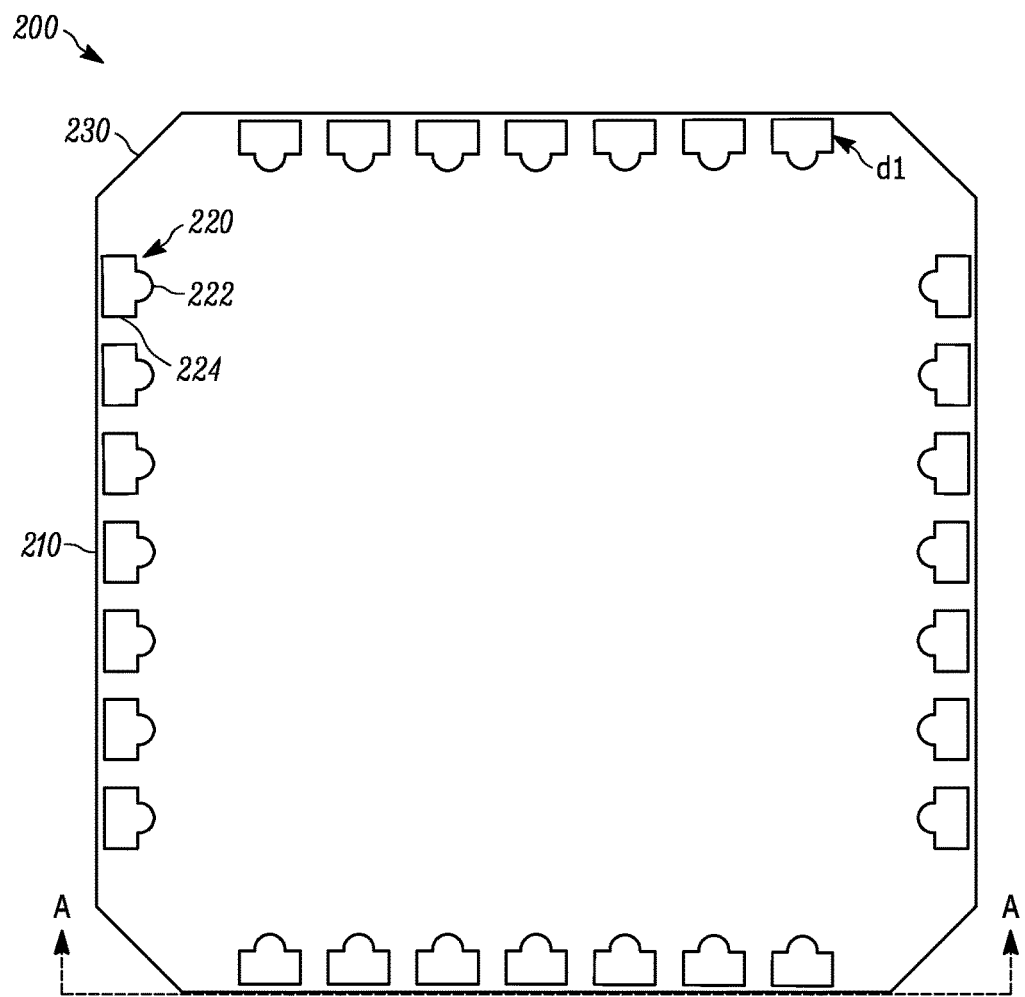
FIG. 2 illustrates a cross-sectional view of the example testing interface.
Figure 6:
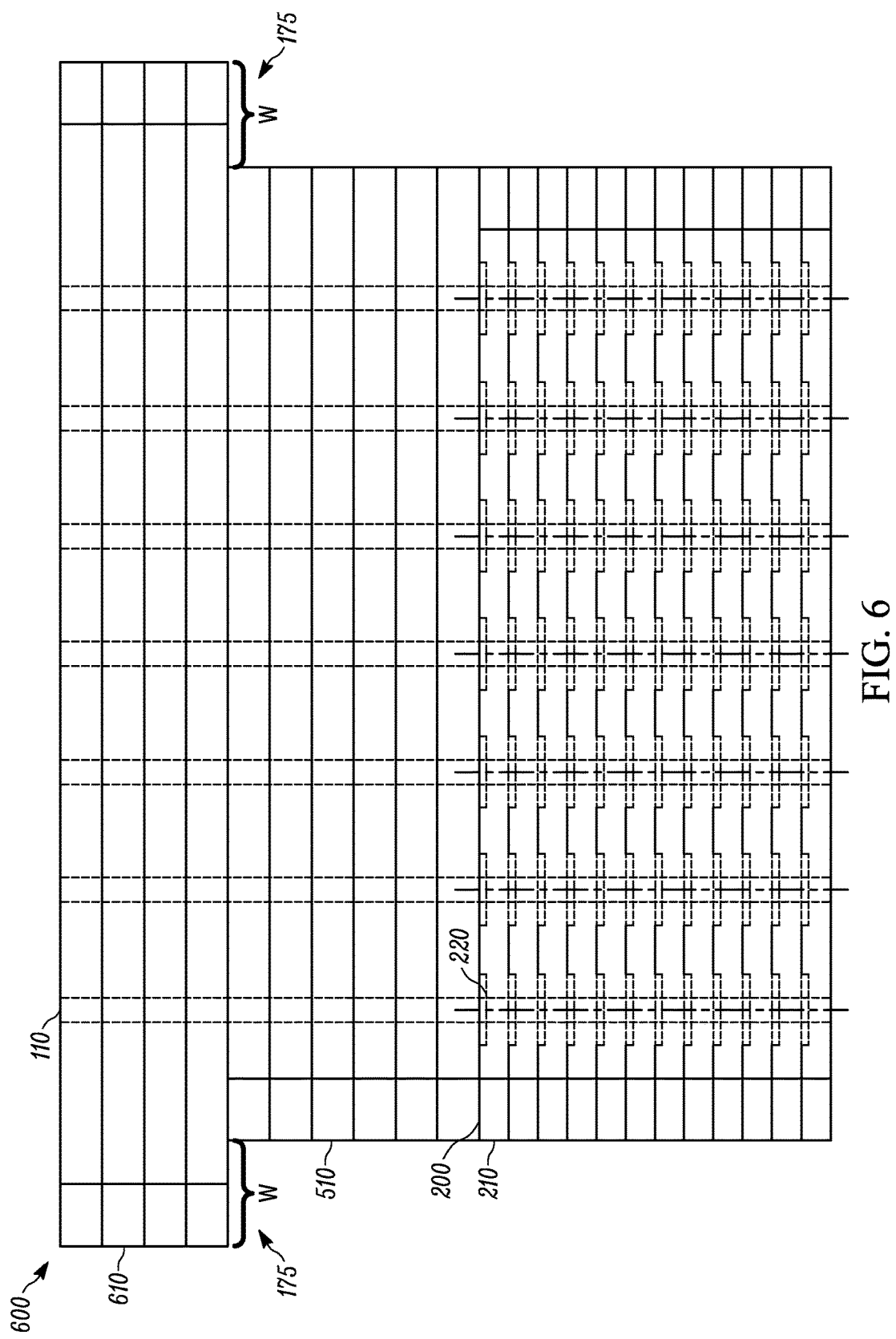
FIG. 6 illustrates a cross-sectional view of yet another example stack of printed circuit boards.

FIG. 2 illustrates a cross-sectional view of the example testing interface 100 along lines A-A prior to vias 110 being drilled through the testing interface 100 and prior to the castellations 130 being added to the stack 600 shown in FIG. 6. The printed circuit board 200 includes four approximately equal length sides, with four corners of the printed circuit board 200 being cut off to produce four angled corner edges 230. Thus, the printed circuit board 200 is octagonal shaped. However, sides of the testing interface 100 can be any length to correspond to the integrated circuit socket 150 that the testing interface 100 will be mounted into. In an example, the printed circuit board 200 is rectangular in shape. Moreover, in another example the angled corner edges 230 are eliminated to create a printed circuit board that includes right angle corners.

The printed circuit board 200 includes a dielectric panel 210 (e.g., an FR-4 panel) and a plurality of conductor pads 220. The plurality of conductor pads 220 are disposed along outer edges of the dielectric panel 210, with the plurality of conductor pads 220 being disposed a distance d1 from an outermost edge of the dielectric panel 210. In the example shown, the printed circuit board 200 includes seven (7) conductor pads 220 along each of the four long edges of the dielectric panel 210. However, the printed circuit board 200 can include more or less conductor pads 220, with the number of conductor pads 220 matching a number of contact pins within the integrated circuit socket 150 that the testing interface 100 is to be mounted into. The plurality of conductor pads 220 are positioned to make electrical contact with the contact pins of the integrated circuit socket 150. In an example, each of the plurality of conductor pads 220 include a rectangular portion 224, a longer side of the rectangular portion 224 being disposed along long edges of the dielectric panel 210. Atop the rectangular portion 224 is a dome portion 222, the dome portion 222 being approximately centered on a side of the rectangular portion 224 farthest from the long edges of the dielectric panel 210.

In an example, the conductor pads 220 are formed in the dielectric panel 210 of the printed circuit board 200 via photolithography. The portions of the panel 210 that do not include the conductor pads 220 are masked to resist etching. A photoresist is patterned on the dielectric panel 210 to act as the mask. The dielectric panel 210 is then subject to etching (e.g., wet etching, plasma etching, etc.) for a time period, dependent upon the etch rate for a particular etching used, to form a cavity. This cavity is filled with a conductor (e.g., copper, gold, etc.) to form the conductor pads 220.

Figure 3:
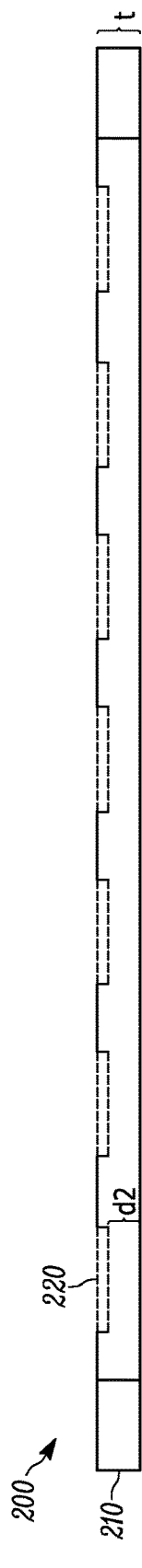
FIG. 3 illustrates a cross-sectional view of a printed circuit board.

FIG. 3 illustrates an example cross-sectional view of the printed circuit board 200 along lines A-A prior to vias 110 and castellations 130 being added to the printed circuit board 200. A bottom edge of the plurality of conductor pads 220 are a distance d2 from the bottom of the printed circuit board 200. The printed circuit board 200 has a thickness t. In an example, the printed circuit board 200 is approximately 0.002 inches in thickness.

Figure 4:
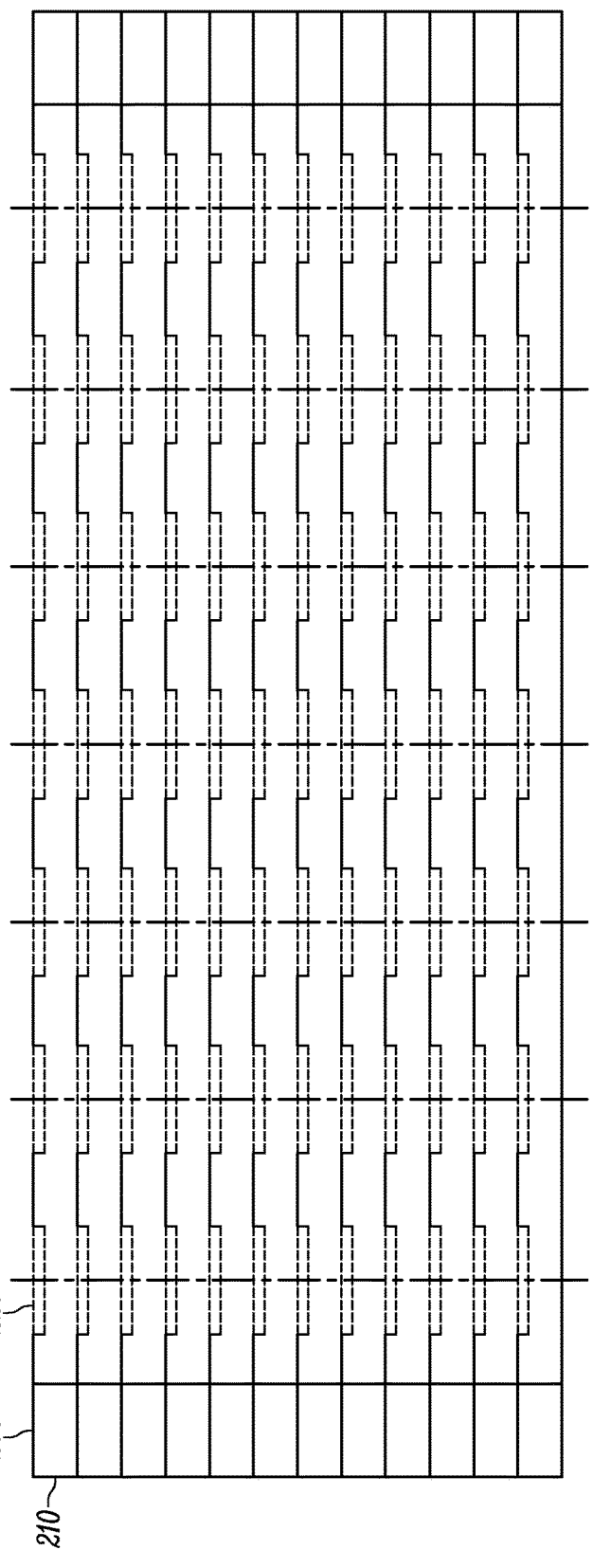
FIG. 4 illustrates a cross-sectional view of an example stack of printed circuit boards.

FIG. 4 illustrates a cross-sectional view of an example stack 400 of printed circuit boards 200 that are laminated together. To build the testing interface 100, approximately same copies of the printed circuit boards 200 are aligned along their edges and stacked, one atop another. As an example, twelve (12) of the printed circuit boards 200 are stacked, one atop another, to form the stack 400. The conductor pads 220 from each of the printed circuit boards 200 are approximately in line with conductor pads 220 of the other printed circuit boards 200. In this example, twelve (12) conductor pads 220 align with twelve (12) conductor pads 220 from each of the other printed circuit boards 200. Thus, in this example the stack 400 includes seven (7) sets of twelve in-line conductor pads 220. To minimize costs, the number of the printed circuit boards 200 that are utilized to construct the testing interface 100 is selected to correspond to dimensions of contact pins of the integrated circuit socket 150. Thus, a deep integrated circuit socket 150 that includes long contact pins will result in utilization of more printed circuit boards 200, and vise versa.

Figure 5:
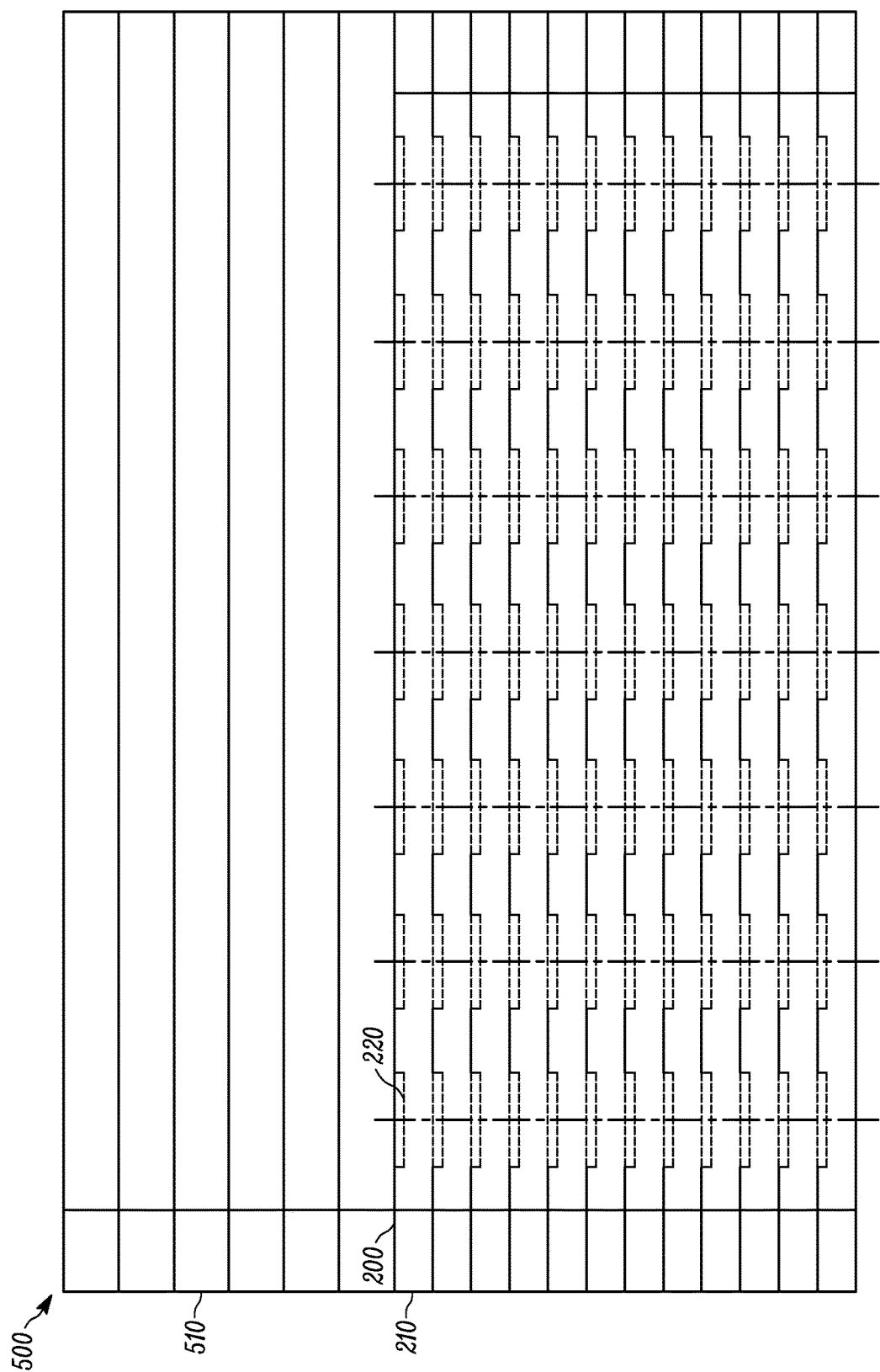
FIG. 5 illustrates a cross-sectional view of another example stack of printed circuit boards.

FIG. 5 illustrates a cross-sectional view of another example stack 500 of printed circuit boards that are laminated together. Atop the stack 400 of printed circuit boards 200 that include conductor pads 220 are further stacked printed circuit boards 510 that lack the conductor pads 220. In the example given, the stack 500 includes six (6) of the printed circuit boards 510. When the testing interface 100 is mounted into the integrated circuit socket 150, the printed circuit boards 510 are disposed in an area above where contact pins of the integrated circuit socket 150 will contact the testing interface 100. Thus, to save costs in manufacturing the testing interface 100 the printed circuit boards 510 lack the conductor pads 220.

In an example, the printed circuit boards 510 are thicker than the printed circuit boards 200. This increased thickness allows the stack 500 to increase in height utilizing less of the printed circuit boards 510. In an example, the printed circuit boards 510 are each approximately 0.112 inches in thickness. Although the stack 500 is illustrated as including six (6) printed circuit boards 510, the number of printed circuit boards 510 utilized to construct the testing interface 100 is dependent upon a desired resultant height of the testing interface 100. Thus, the testing interface 100 may include more or less printed circuit boards 510 to achieve the desired resultant height.

FIG. 6 illustrates a cross-sectional view of yet another example stack 600 of printed circuit boards that are laminated together. Atop the stack 500 of printed circuit boards 200/510 are further stacked printed circuit boards 610 that lack the conductor pads 220. The printed circuit boards 610 are wider by a dimension 2×W than the printed circuit boards 510 below them, forming winged extensions 175 on both sides of the stack 600 of a width W. This additional width allows a technician to more easily grasp the testing interface 100. In an example, this additional width provides a portion to which bracket mounting holes 120 are disposed in the printed circuit boards 610. The printed circuit boards 200/510/610 are laminated together to form the basis for the testing interface 100. In an example, the printed circuit boards 200/510/610 are laminated together in a single pressing, with an adhesive (e.g., epoxy) utilized between each layer of the printed circuit boards 200/510/610 to bond them together.

After the printed circuit boards 200/510/610 are laminated together to form the testing interface 100, the vias 110 are drilled from a top surface created by the stack 600 through to a bottom surface created by the stack 600. The vias 110 are drilled along the long edges of the stack 600, aligning with the both the dome portion 222 and the rectangular portion 224 of the conductor pads 220. Moreover, additional vias 112 are drilled through the central portion of the stack 600, beneath a location where an integrated circuit 170 (e.g., press contact integrated circuit die) is mounted. These additional vias 112 couple the top of the stack 600 to a bottom pad 160 on the bottom of the stack 600, the bottom pad 160 providing a ground coupling for the integrated circuit 170 mounted on the testing interface 100. Moreover, the bottom pad 150 also provides a thermal path to assist in cooling the integrated circuit 170.

In addition to the vias 110 and additional vias 112 shown in FIGS. 1A-E, the mounting holes 120 shown in FIGS. 1A-E are drilled through the winged extensions 175 from a top surface of the stack 600 to a bottom surface of the stack of printed circuit boards 610. The mounting holes 120 provide a mechanical point at which the mounting bracket 180 is secured to the testing interface 100, the mounting bracket 180 securing the integrated circuit 170 to the testing interface 100. The mounting bracket 180 maintains vertical pressure against the integrated circuit 170 to allow the integrated circuit 170 to maintain consistent electrical contact with conductor bumps 125 (e.g., copper conductor bumps, solder conductor bumps, etc.). The conductor bumps 125 are deposited on the top surface of the stack 600 at appropriate locations that correspond to electrical connections of the integrated circuit 170.

Figure 7:
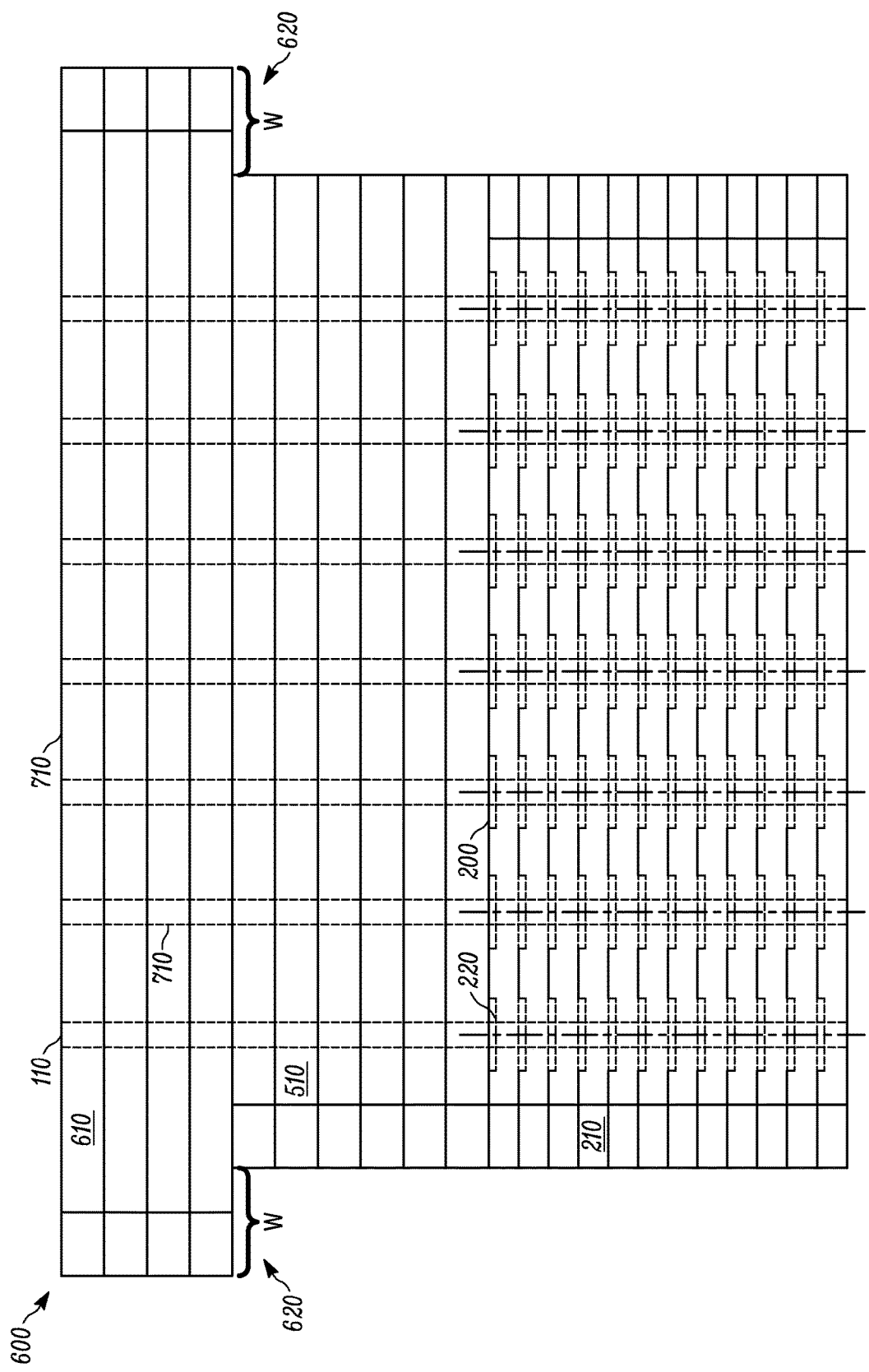
FIG. 7 illustrates an example electrical conductor plating on the stack shown in FIG. 6.

After the vias 110 and the mounting holes 120 are drilled through the stack 600, the stack 600 is subject to a plating bath that plates all surface of the stack 600 including insides of the vias 110/112 with an electrical conductor 710 (e.g. copper), shown in FIG. 7. This plating deposit on the inside of the vias 110/112 forms conductive paths between the layers of the stack 600. Such plating deposit electrically couples the conductor pads 220 with the top surface of the stack 600. The top surface of the stack 600 is then subject to photoresist patterning and etching (e.g., wet etching, plasma etching, etc.) to create the electrical traces 115 on the top surface of the testing interface 100. The electrical traces 115 couple the vias 110 with the conductor bumps 125, thus coupling the conductor pads 220 with the conductor bumps 125, respectively.

After the electrical traces 115 are formed, the castellations 130 are formed on the outside edges of the stack 600. The castellations 130 are formed at locations that correspond to a plurality of contact pins of the integrated circuit socket 150. The castellations 130 are formed by first utilizing a mechanical router (not shown) to cut away a portion of the stack 400 that corresponds to locations of the conductor pads 220. A portion of the stack 400 that corresponds to locations of the conductor pads is cut away by the router without exposing the conductor pads 220. The router cuts away the dielectric panel 210 of the printed circuit boards 200 at such locations without exposing or cutting into the conductor pads 220. Thereafter, the routed locations are subject to etching (e.g., wet etching, plasma etching, etc.). A photoresist is patterned on the stack 600 to act as a mask. The stack 600 is then subject to etching to remove portions of the stack 600 and create the castellations 130 along the sides of the testing interface 100 that correspond to contact pins of the integrated circuit socket 150.

Figure 8:
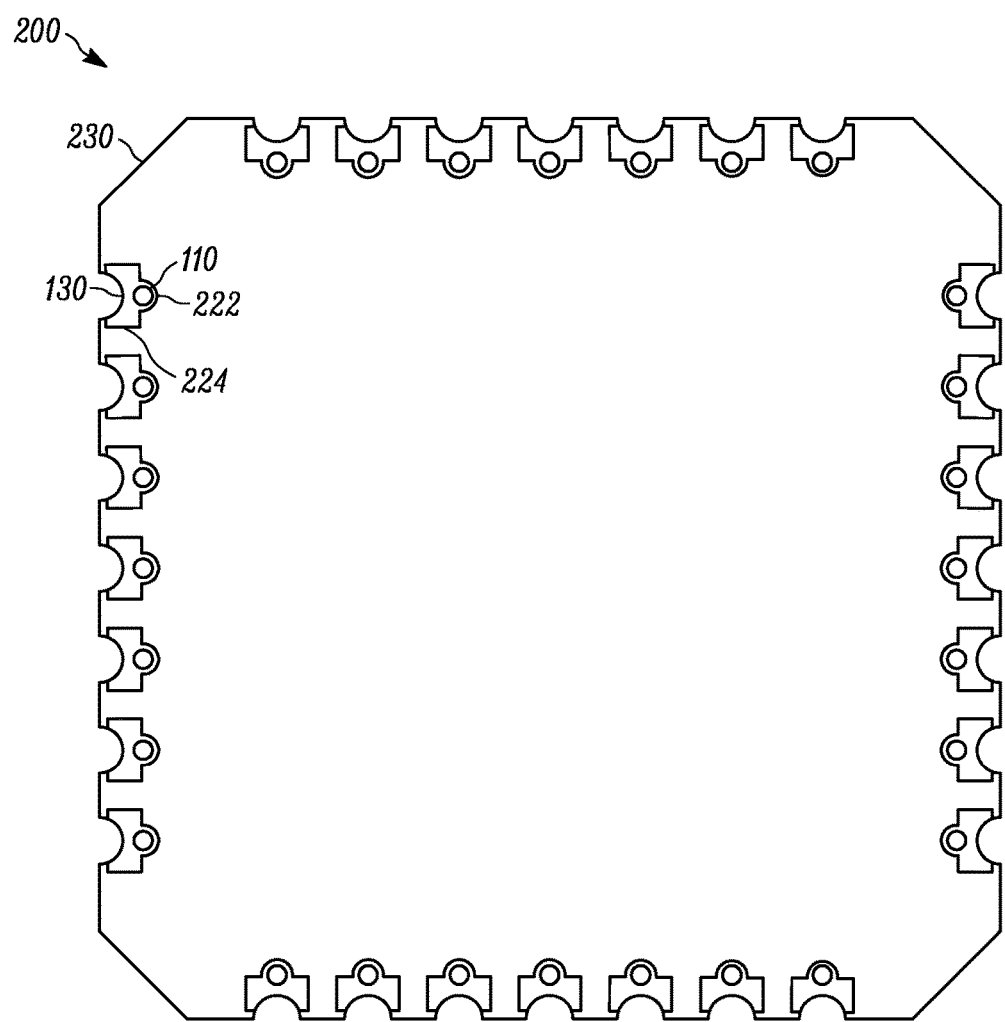
FIG. 8 illustrates another cross-sectional view of the example testing interface.

FIG. 8 illustrates another cross-sectional view of the example testing interface 100 along lines A-A after the vias 110 are drilled through the stack 600 and after the castellations 130 are added to the stack 600. One via 110 is disposed through each of the conductor pads 220 of the printed circuit boards 200. Approximately half of a particular via 110 is disposed within the dome portion 222 of the conductor pad 220 and approximately another half of the via 110 is disposed within the rectangular portion 224 of the conductor pad 220. The castellations 130 are concave indentations into the rectangular portion 224 of the conductor pad 220 from an outer edge of the testing interface 100, the dimensions of the indentations corresponding to dimensions of contact pins of the integrated circuit socket 150.

Figure 9:
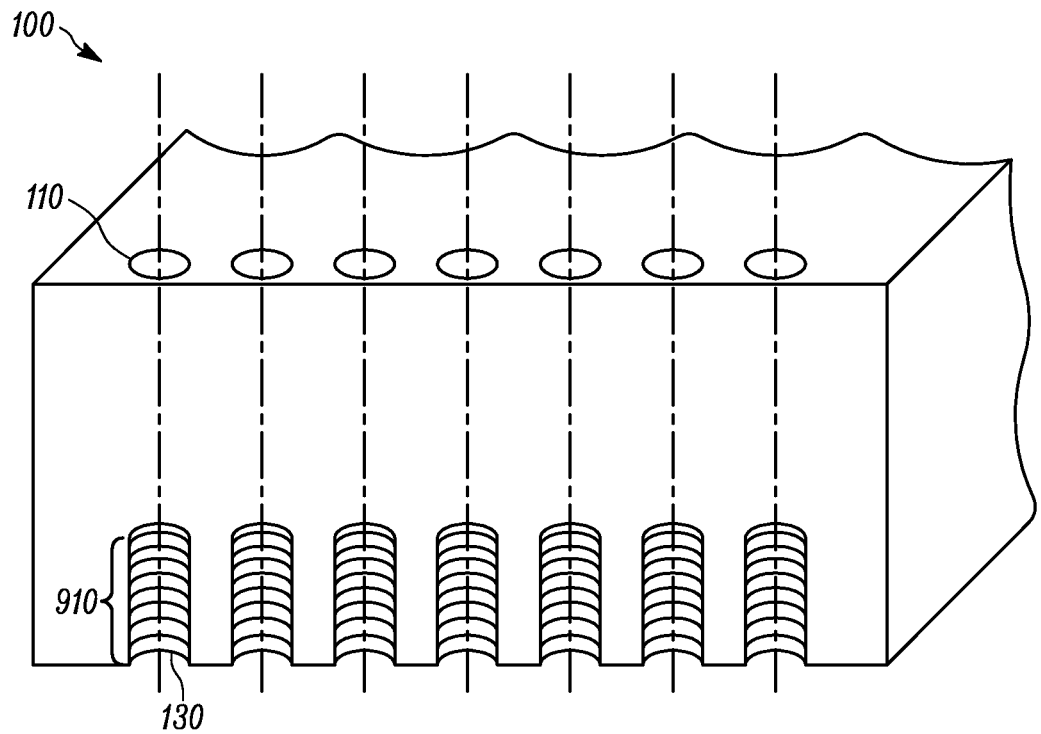
FIG. 9 illustrates a side view of a portion of the example testing interface including the exposed conductor pads.

FIG. 9 illustrates a side view of a portion of the example testing interface 100 including the exposed conductor pads 220. After the stack 600 is routed and etched, the conductor pads 220 become exposed on the sides of the testing interface 100. Layers of conductor pads 220 are exposed within each castellation 130, forming a comb structure 910 within each castellation 130. This comb structure 910 in each of the castellations 130 collectively provides electrical contact points for the contact pins of the integrated circuit socket 150.

Figure 10:
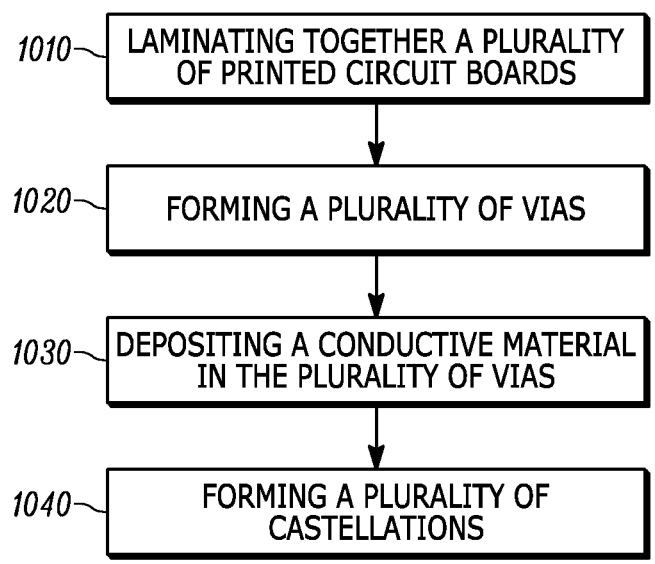
FIG. 10 illustrates an example method for making the testing interface.

In view of the foregoing structural and functional features described above, a method in accordance with various aspects of the present disclosure will be better appreciated with reference to FIG. 10. While, for purposes of simplicity of explanation, the method of FIG. 10 is shown and described as executing serially, it is to be understood and appreciated that the present disclosure is not limited by the illustrated order, as some aspects may, in accordance with the present disclosure, occur in different orders and/or concurrently with other aspects from that shown and described herein. Moreover, not all illustrated features may be required to implement a method in accordance with an aspect of the present disclosure.

FIG. 10 illustrates an example method 1000 for making the testing interface 100. At 1010, the method 1000 laminates together a plurality of printed circuit boards, e.g., the plurality of printed circuit boards 200/510/610. The plurality of printed circuit boards 200 includes the dielectric panel 210 and the plurality of conductor pads 220. A topmost stack of printed circuit boards 610 may include wing extensions 175 on at least two sides thereof, the wing extensions 175 including mounting holes 120 to secure the mounting bracket 180 against an integrated circuit 170 coupled to the topmost printed circuit board 610.

At 1020, the method 1000 forms a plurality of vias, e.g., the plurality of vias 110. The plurality of vias 110 are formed through the plurality of conductor pads 220, respectively. The vias 110 are drilled along the long edges of the stack 600, aligning with the both the dome portion 222 and the rectangular portion 224 of the conductor pads 220. Approximately half of a particular via 110 is disposed within the dome portion 222 of the conductor pad 220 and approximately another half of the via 110 is disposed within the rectangular portion 224 of the conductor pad 220.

At 1030, the method 1000 deposits a conductive material 710 in the plurality of vias 110. The conductive material 710 is deposited in the plurality of vias 110 to electrically couple the plurality of conductor pads 220 with each other, respectively. In an example, the conductive material is copper plating. This copper plating is further used to form the plurality of wire traces 115 on a top of the testing interface 100, to electrically couple the plurality of conductor pads 220 to a plurality of contact pins of an integrated circuit 170 coupled to the topmost printed circuit board 610.

At 1040, the method 1000 forms a plurality of castellations, e.g., the plurality of castellations 130. The plurality of castellations 130 are formed on at least one side of the plurality of printed circuit boards 200, to electrically couple a plurality of contact pins of an integrated circuit socket 150 with the plurality of conductor pads 220 of the plurality of printed circuit boards 200, respectively. In an example, the integrated circuit socket 150 is a leadless chip carrier (LCC) socket. The plurality of castellations 130 are formed by mechanically milling of the plurality of printed circuit boards 200 proximate to the plurality of conductor pads 220 to expose a surface of the plurality of conductor pads 220. Thereafter, the plurality of printed circuit boards 200 are etched to create the castellations 130.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A device, comprising:
    a plurality of printed circuit boards laminated together, at least some of the plurality of printed circuit boards including a dielectric panel and a plurality of conductor pads;
    a plurality of vias, through the plurality of conductor pads, including a conductive material to respectively electrically couple the plurality of conductor pads with each other; and
    a plurality of castellations, on at least one side of the plurality of printed circuit boards, to electrically couple each of a plurality of contact pins of an integrated circuit socket with respective contact pads of the plurality of conductor pads.

2. The device of claim 1, wherein the conductive material is a copper plating.

3. The device of claim 1, further comprising a topmost printed circuit board that includes a plurality of wire traces to electrically couple the plurality of conductor pads to a respective plurality of conductor bumps disposed on the topmost printed circuit board, the plurality of conductor bumps electrically coupling an integrated circuit to the plurality of wire traces on the topmost printed circuit board.

4. The device of claim 1, further comprising a topmost printed circuit board that includes wing extensions on at least two sides of the topmost printed circuit board, the wing extensions including mounting holes to secure a mounting bracket against an integrated circuit coupled to the topmost printed circuit board.

5. The device of claim 1, wherein the plurality of printed circuit boards are mechanically milled proximate to the plurality of conductor pads without exposing the plurality of conductor pads.

6. The device of claim 5, wherein the plurality of printed circuit boards are further etched to expose the plurality of conductor pads and form the plurality of castellations.

7. The device of claim 1, wherein the plurality of printed circuit boards are a first plurality of printed circuit boards, the device further comprising:
    a second plurality of printed circuit boards, lacking the plurality of conductor pads included with the first plurality of printed circuit boards, laminated on the first plurality of printed circuit boards.

8. The device of claim 1, wherein the integrated circuit socket is a leadless chip carrier (LCC) socket.

9. A method, comprising:
    laminating together a plurality of printed circuit boards, at least some of the plurality of printed circuit boards including a dielectric panel and a plurality of conductor pads;
    forming a plurality of vias through the plurality of conductor pads, respectively;
    depositing a conductive material in the plurality of vias to electrically couple the plurality of conductor pads with each other; and
    forming a plurality of castellations, on at least one side of the plurality of printed circuit boards, to electrically couple each of a plurality of contact pins of an integrated circuit socket with respective contact pads of the plurality of conductor pads.

10. The method of claim 9, wherein the conductive material is a copper plating.

11. The method of claim 9, further comprising forming a plurality of wire traces, on a topmost printed circuit board, to electrically couple the plurality of conductor pads to a plurality of conductor bumps disposed on the topmost printed circuit board, respectively, the plurality of conductor bumps electrically coupling an integrated circuit to a plurality of wire traces on the topmost printed circuit board.

12. The method of claim 9, further comprising laminating a topmost printed circuit board that includes wing extensions on at least two sides of the topmost printed circuit board to the plurality of printed circuit boards, the wing extensions including mounting holes to secure a mounting bracket against an integrated circuit coupled to the topmost printed circuit board.

13. The method of claim 9, further comprising mechanically milling the plurality of printed circuit boards proximate to the plurality of conductor pads without exposing the plurality of conductor pads.

14. The method of claim 13, further comprising etching the plurality of printed circuit boards to expose the plurality of conductor pads and form the plurality of castellations.

15. The method of claim 9, wherein the plurality of printed circuit boards are a first plurality of printed circuit boards, the method further comprising:
    laminating a second plurality of printed circuit boards, lacking the plurality of conductor pads included with the first plurality of printed circuit boards, on the first plurality of printed circuit boards.

16. The method of claim 9, wherein the integrated circuit socket is a leadless chip carrier (LCC) socket.

17. A device, comprising: a first plurality of printed circuit boards laminated together, each printed circuit board of the first plurality of printed circuit boards including a dielectric panel and a plurality of conductor pads; a second plurality of printed circuit boards, lacking the plurality of conductor pads included with the first plurality of printed circuit boards, laminated together and to the first plurality of printed circuit boards; a plurality of vias, through the plurality of conductor pads, including a conductive material to respectively electrically couple the plurality of conductor pads with each other; a plurality of castellations, on at least one side of the plurality of printed circuit boards, to electrically couple each of a plurality of contact pins of an integrated circuit socket with respective contact pads of the plurality of conductor pads; and a plurality of wire traces, on a topmost printed circuit board, to electrically couple the plurality of conductor pads to a plurality of conductor bumps disposed on the topmost printed circuit board, the plurality of conductor bumps electrically coupling an integrated circuit to the plurality of wire traces.

18. The device of claim 17, wherein the integrated circuit socket is a leadless chip carrier (LCC) socket.

19. The device of claim 17, wherein the topmost printed circuit board includes wing extensions on at least two sides of the topmost printed circuit board, the wing extensions including mounting holes to secure a mounting bracket against an integrated circuit coupled to the topmost printed circuit board.

20. The device of claim 17, wherein the first plurality of printed circuit boards are mechanically milled proximate to the plurality of conductor pads without exposing the plurality of conductor pads and further etched to expose the plurality of conductor pads and form the plurality of castellations.

* * * * *